(12) United States Patent
Ao

(10) Patent No.: US 7,830,992 B2
(45) Date of Patent: Nov. 9, 2010

(54) AMPLIFIER WITH A QUADRATURE AMPLITUDE MODULATION (QAM) MODULATED AND A CONTINUOUS WAVE AUTOMATIC GAIN CONTROL (AGC) CIRCUIT

(76) Inventor: Jiening Ao, 1041 Heathchase Dr., Suwanee, GA (US) 30024

( * ) Notice: Subject to any disclaimer, the term of this patent is extended or adjusted under 35 U.S.C. 154(b) by 655 days.

(21) Appl. No.: 11/828,456

(22) Filed: Jul. 26, 2007

(65) Prior Publication Data
US 2009/0029661 A1 Jan. 29, 2009

(51) Int. Cl.
*H04L 27/08* (2006.01)
(52) U.S. Cl. .................. 375/345; 375/297; 375/316; 330/302; 330/304; 455/249.1; 455/240.1
(58) Field of Classification Search .............. 375/297, 375/345, 295, 316; 330/302, 304, 75, 144, 330/51; 455/249.1, 240.1
See application file for complete search history.

(56) References Cited

U.S. PATENT DOCUMENTS

| | | | | |
|---|---|---|---|---|
| 6,498,926 B1 * | 12/2002 | Ciccarelli et al. | ........ | 455/240.1 |
| 6,563,891 B1 * | 5/2003 | Eriksson et al. | ............ | 375/345 |
| 6,735,423 B1 * | 5/2004 | Uskali et al. | ............ | 455/249.1 |
| 7,656,227 B1 * | 2/2010 | Beaudoin et al. | ............ | 330/51 |
| 2004/0100325 A1 * | 5/2004 | van Amerom | ............ | 330/144 |
| 2005/0025504 A1 * | 2/2005 | Huang et al. | ............ | 398/202 |
| 2005/0220217 A1 | 10/2005 | Yamawaki et al. | | |
| 2005/0259186 A1 | 11/2005 | Mehr et al. | | |

FOREIGN PATENT DOCUMENTS

WO    WO 00/31867 A    6/2000

OTHER PUBLICATIONS

International Search Report—3 pgs, filed Oct. 28, 2008, Scientific-Atlanta, Inc.

* cited by examiner

*Primary Examiner*—Phuong Phu
(74) *Attorney, Agent, or Firm*—Tarolli, Sundheim, Covell & Tummino LLP

(57) ABSTRACT

The present invention is directed to systems and methods for providing an AGC circuit for maintaining a constant output power level from an amplifier. More specifically, the AGC circuit includes a circuitry for determining whether an input signal is a QAM or a CW signal. A QAM/CW gain switch is then controlled depending upon the input signal. Depending upon the mode of the QAM/CW gain switch, the AGC circuit either attenuates the power level of the signal or bypasses the signal. The bypassed or attenuated signal is then compared to a reference signal so that the AGC circuit produces an adjusting voltage accordingly. The amplifier finally receives the adjusting voltage and attenuates the output power level of the signal.

18 Claims, 5 Drawing Sheets

AMPLIFIER WITH A QUADRATURE AMPLITUDE MODULATION (QAM) MODULATED AND A CONTINUOUS WAVE AUTOMATIC GAIN CONTROL (AGC) CIRCUIT

FIELD OF THE INVENTION

The present invention relates generally to amplifiers, and more specifically to automatic gain control circuits.

BACKGROUND OF THE INVENTION

Amplifiers include automatic gain control (AGC) circuits to ensure that the power level output signal remains constant. Typically, a quadrature amplitude modulation (QAM) modulated signal is transmitted from a headend facility and transmitted downstream to amplifiers for amplification and subsequently to subscriber equipment for final processing. An amplifier having a single pilot QAM AGC detector typically includes a bandpass filter (BPF) that has a 3 dB (decibel) bandwidth narrower than the QAM signal bandwidth, which is transmitted in a channel, to ensure that the BPF has a sufficient out-of-band rejection to reject the signal in the adjacent channels.

At times, however, the QAM modulation is turned off resulting in a continuous wave (CW) signal, which has, in concept, a 3 dB bandwidth of 0 Hz (Hertz). So when the QAM modulation is turned off, the signal power level filtered by the BPF and sensed by the AGC circuit is somewhat higher than when the QAM modulation is on. The exact amount depends on the system requirement and the design of the filter, but it is typically between 1 and 6 dB. Consequently, since the AGC circuit determines the output power level within the entire channel, the amplifier then incorrectly adjusts the power level lower by the same amount, e.g., 1-6 dB. Therefore, what is needed is a system and method for detecting the on and off condition of the QAM modulation as well as maintain the desired output power level of the amplifier regardless whether the QAM modulation is on or off.

BRIEF DESCRIPTION OF THE DRAWINGS

The invention can be better understood with reference to the following drawings. The components in the drawings are not necessarily drawn to scale, emphasis instead being placed upon clearly illustrating the principles of the invention. In the drawings, like reference numerals designate corresponding parts throughout the several views.

DETAILED DESCRIPTION

Preferred embodiments of the invention can be understood in the context of a broadband communications system. Note, however, that the invention may be embodied in many different forms and should not be construed as limited to the embodiments set forth herein. All examples given herein, therefore, are intended to be non-limiting and are provided in order to help clarify the description of the invention.

The present invention is directed towards an AGC circuit that detects a power level of a signal at the output of an amplifier. The AGC circuit then adjusts the power level according to a reference power level so that the output power level of the signal remains constant. An advantage of the present invention is that the AGC circuit is capable of dynamically discriminating between both a QAM modulated signal and a CW signal. In this manner, the AGC circuit of the present invention correctly adjusts the output power level regardless of the input signal.

Figure 1:
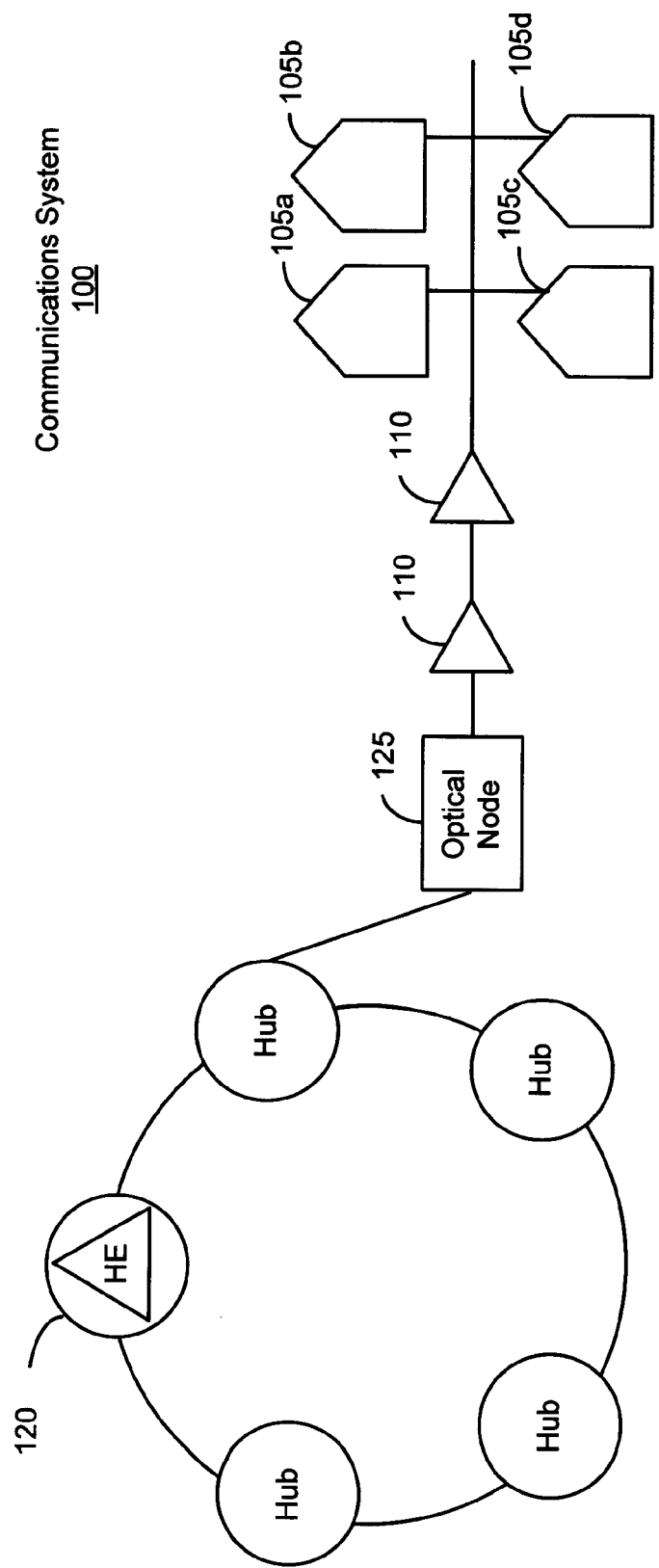
FIG. 1 is a block diagram of a communications system that typically includes amplifiers for boosting the power level of signals during transmission to subscriber equipment, such as set-top boxes, cable modems, etc.

FIG. 1 is a block diagram of a communications system 100 that typically includes amplifiers 110 for boosting the power level of signals during transmission to subscriber equipment 115, such as set-top boxes, cable modems, etc. The signals are generally QAM modulated by headend equipment 120 prior to transmission to optical nodes 125, which convert the optical signals into electrical signals. The amplifiers 110 then amplify the QAM modulated signals received from the optical nodes 125 and further transmit the amplified signals downstream.

Figure 2:
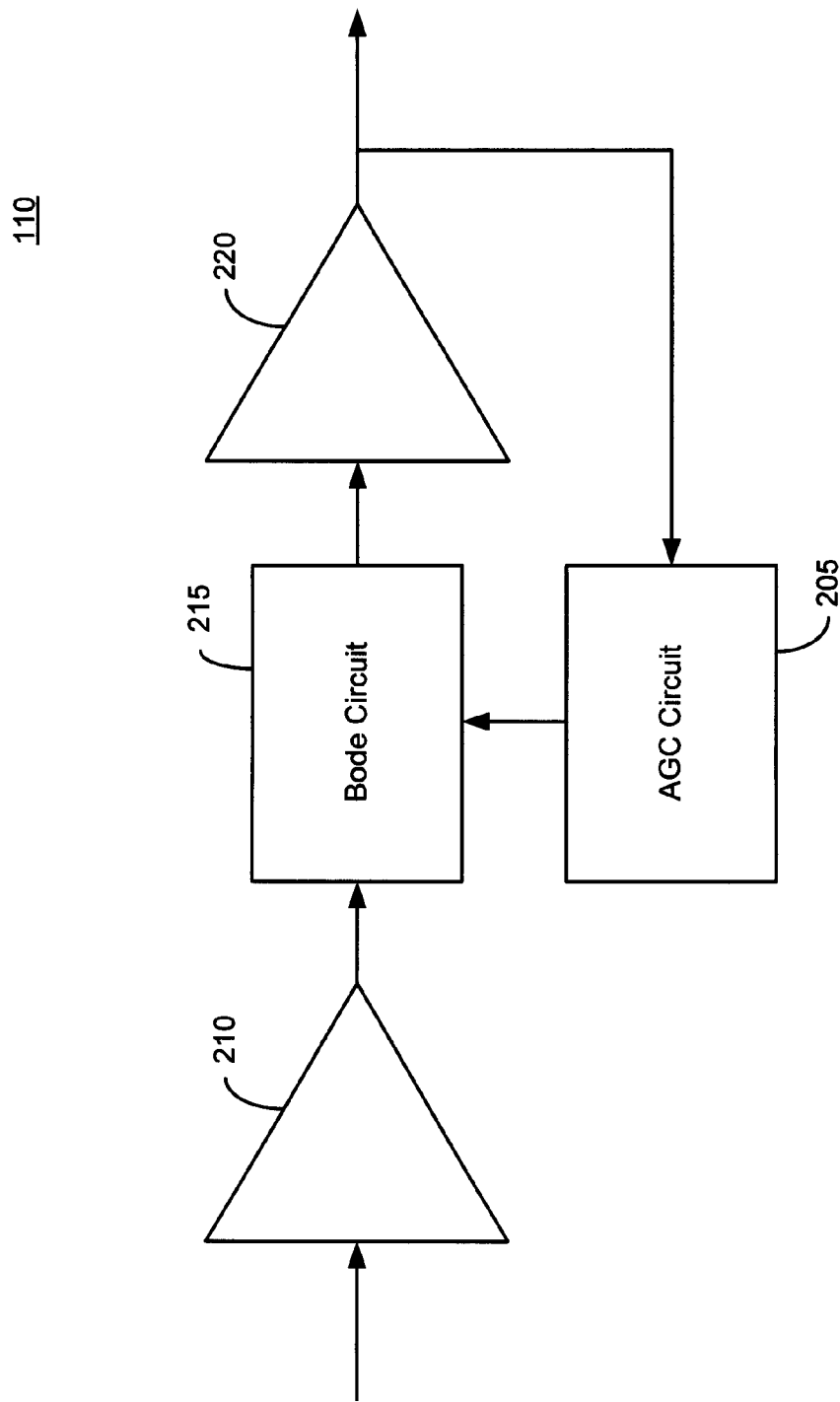
FIG. 2 is an electrical block diagram of a conventional amplifier that includes an AGC circuit.

FIG. 2 is an electrical block diagram of a conventional amplifier 110 that includes a QAM AGC circuit. The AGC circuit 205 is capable of monitoring a QAM modulated pilot carrier signal in the forward signals. The DC voltage values of the pilot carrier signals include multi-level data having peak values at varying times and different rates. Initially, the forward signals are transmitted through one or more gain stages 210 for amplifying the forward signal. A Bode circuit 215 varies the signal level by attenuation in accordance with the amplifier design. A final output gain stage 220 subsequently processes the forward signal, if necessary, which is then transmitted to an output port 225 for further transmission downstream. The output of the final gain stage 220 is also coupled to the AGC circuit 205 that is used to further control the attenuation of the Bode circuit 215 in response to the power level of the amplified forward signal.

Figure 3:
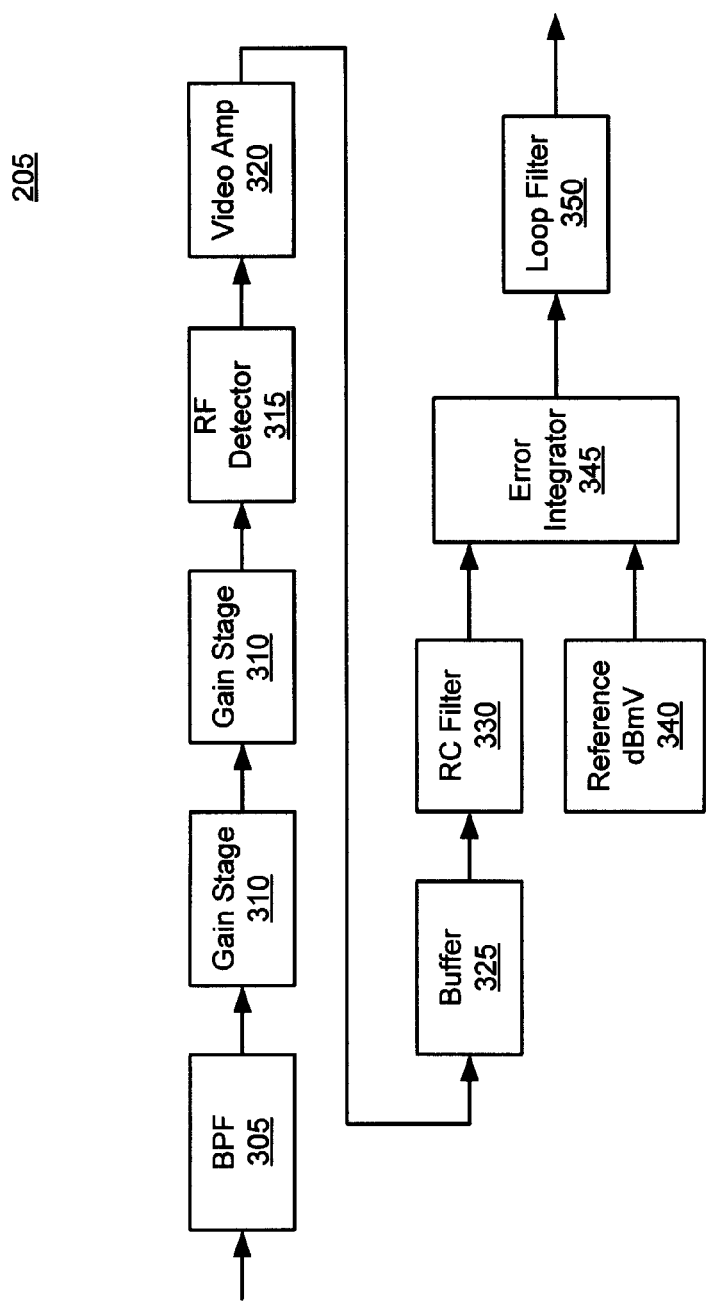
FIG. 3 is an electrical block diagram of the conventional QAM AGC circuit of FIG. 2.

FIG. 3 is an electrical block diagram of the conventional QAM AGC circuit 205 of FIG. 2. The AGC circuit 205 includes a bandpass filter (BPF) 305 and one or more gain stages 310 for filtering and amplifying, respectively, the pilot signal. The filtered pilot signal is then transmitted to a radio frequency (RF) detector 315 that demodulates the signal to recover a baseband modulating signal. The demodulated baseband signal is then amplified through a video amplifier 320. A buffer 325 and a resistor-capacitor (RC) filter 330 then average the baseband signal in order to establish a DC voltage that represents the average power level voltage of the QAM carrier. An error integrator 345 then compares the average voltage with a reference voltage 340 and provides an adjusting voltage to a loop filter 350 for filtering. The filtered adjusting voltage is provided to the Bode circuit 215 for attenuation as necessary so that the amplifier 110 continues to provide a stable signal having a desired power level.

As previously mentioned, due to the constraints on adjacent channel rejection and the limitation of filter sharpness, a practical BPF 305 would have the passband bandwidth narrower than the symbol rate of the QAM signal. Therefore, the detected power is less than the full channel power, for example, 3 to 6 dB (decibel) less. Accordingly, this loss in detected power is designed into the AGC 205 so that an incorrect adjustment is not made. The AGC circuit 205 is then useful in adjusting a QAM modulated signal, but at times, it is advantageous to turn the QAM modulation off for amplifier balancing or trouble shooting. When the QAM modulation is turned off, the signal is a CW signal where the peak power equals the average power. When a CW signal is received, the QAM AGC 205 detects 3-6 dB more power as designed by the amplifier than compared to when the QAM modulation is on and incorrectly adjusts the output power level 3-6 dB lower.

Figure 4:
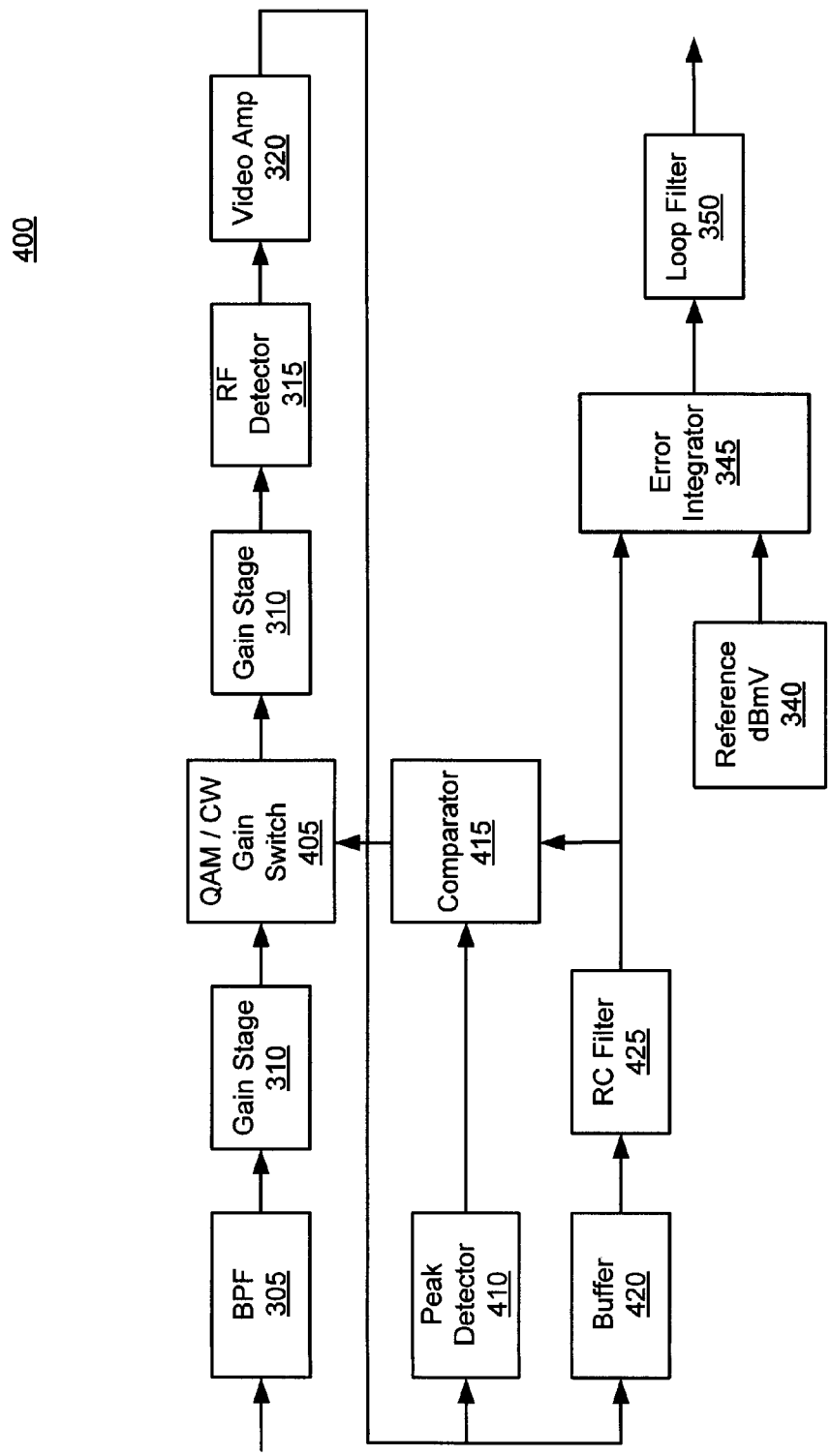
FIG. 4 is an electrical block diagram of an AGC circuit for adjusting the power level of an amplifier in accordance with the present invention.

FIG. 4 is an electrical block diagram of an AGC circuit for adjusting the power level of an amplifier regardless of input signal in accordance with the present invention. An input signal, which may be either a QAM modulated signal or a CW signal, is received at the BPF 305. The BPF 305 filters the input signal and allows a predetermined pilot carrier signal to pass through to a first gain stage 310. The gain stage 310 amplifies the signal to some power level depending upon many factors, such as the location of the amplifier in the system 100. A QAM/CW gain switch 405, which is discussed further below, receives the amplified signal and forwards it to the second gain stage 310 for further amplifying, if necessary. The RF detector 315 demodulates the signal to recover a baseband modulated signal. The demodulated baseband signal is then amplified through the video amplifier 320.

In accordance with the present invention, a peak detector 410 samples pulses of the demodulated signal to establish a peak voltage, which is then provided to a comparator 415. Concurrently, a buffer 420 and an RC filter 425 also receive the demodulated signal. The buffer and RC filter combination averages the demodulated signal and provides the comparator 415 an averaged voltage. The comparator 415 then determines from the two received signals whether a QAM signal or a CW signal is present. More specifically, if a QAM signal is present, the peak voltage detected by the peak detector 410 will be greater than the average voltage provided by the buffer and RC filter combination. Furthermore, if a CW signal is present, the peak voltage is equal to the average voltage. It will be appreciated that the comparator 415 can be implemented using either hardware, software, or a combination of both.

Figure 5:
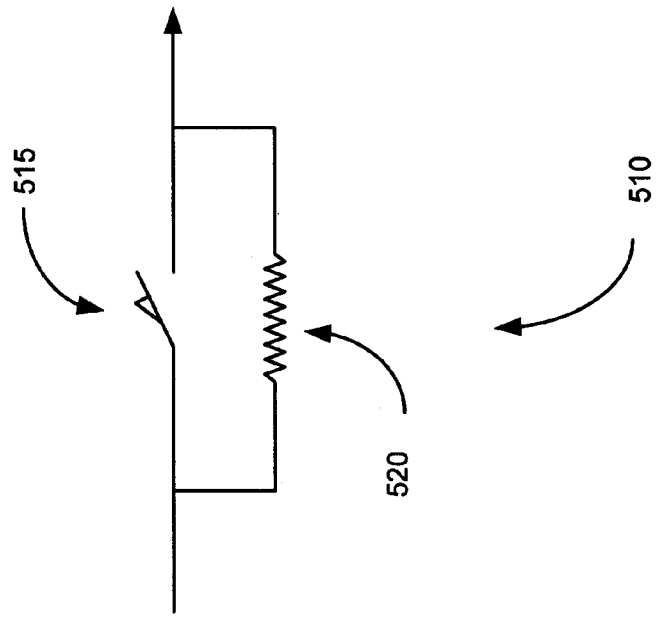
FIG. 5 illustrates the QAM/CW gain switch in accordance with the present invention.
Figure 5:
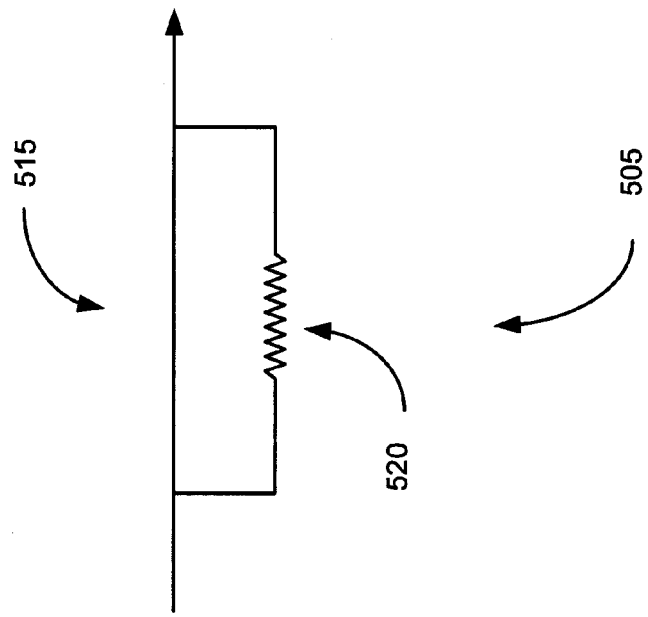

FIG. 5 illustrates the QAM/CW gain switch 405 in accordance with the present invention. When the comparator 415 determines that the input signal is a QAM modulated signal, the comparator 415 positions the QAM/CW gain switch 405 in a first mode 505. When the comparator 415 determines that the input signal is a CW signal, the comparator 415 positions the QAM/CW gain switch 405 in a second mode 510. Depending upon the position of an internal switch 515, there is a difference in the adjusted power value of the input signal. The QAM/CW gain switch 405 accommodates the differences in measured power levels of the channel regardless of the input signal.

More specifically, when the input signal is a QAM modulated signal, the internal switch 515 is closed ensuring a additional 0 dB of gain. The error integrator 345 receives the averaged signal having a 0 dB of additional gain from the output of the RC filter 425 and compares the power level of the averaged signal with the reference output power level 340. The error integrator 345 then provides an adjusting voltage accordingly to a loop filter 350 for filtering. The filtered adjusting voltage is provided to the Bode circuit 215 so that the amplifier continues to provide a stable signal having a desired power level.

On the other hand, when the input signal is a CW signal, the internal switch 515 is opened forcing the input signal through a resistor 520 having some attenuation value ensuring that there is, for example, a 3 dB loss. It will be appreciated that the dB attenuation value can be adjusted, for example, some value between 3 and 6 dB, depending upon the design of the amplifier. The error integrator 345 receives the averaged signal having a 3 dB loss from the output of the RC filter 425 and compares the power level of the averaged signal with the reference output power level 340. The error integrator 345 then provides an adjusting voltage accordingly to a loop filter 350 for filtering. The filtered adjusting voltage is subsequently provided to the Bode circuit 215 so that the amplifier continues to provide a stable signal having a desired power level.

Therefore, an AGC circuit has been described that can receive both a QAM modulated and CW input signals while providing accurate output power levels. While this invention has been described in conjunction with the specific embodiments thereof, it is evident that many alternatives, modifications and variations will be apparent to those skilled in the art. Accordingly, the preferred embodiments of the invention, as set forth herein, are intended to be illustrative and not limiting. Various changes may be made without departing from the truth and the full scope of the invention as defined by the following claims.

What is claimed is:

1. An automatic gain control (AGC) circuit for receiving an input signal having an input power level and for maintaining an output signal having a desired output power level, the AGC circuit comprising:
   a peak detector for detecting a peak voltage of the input signal;
   an averaging circuit for determining an average voltage of the input signal;
   a comparator for receiving the peak voltage and the averaged voltage, and for determining whether the input signal is one of a QAM signal or a CW signal;
   a QAM/CW gain switch controlled by the comparator, the QAM/CW gain switch for passing the input signal when determined to be a QAM signal, and for bypassing the input signal when determined to be a CW signal, wherein when the input signal is bypassed, the input power level of the input signal is attenuated by a predetermined level; and
   an error integrator for receiving the averaged voltage having been one of bypassed or attenuated, the error integrator for providing an adjusting voltage, wherein the adjusting voltage ensures the desired output power level.

2. The AGC circuit of claim 1, wherein the error integrator receives a reference voltage and determines the adjusting voltage by comparing the reference voltage and the averaged voltage.

3. The AGC circuit of claim 1, further comprising a bandpass filter, wherein the QAM and CW input signals are transmitted in a channel, wherein the bandpass filter filters less than the full QAM input signal in the channel, thereby decreasing the detected power level.

4. The AGC circuit of claim 3, wherein the bandpass filter filters the full CW input signal in the channel, thereby providing an accurate power level of the CW input signal.

5. The AGC circuit of claim 1, wherein an amplifier includes the AGC circuit for providing an amplified output signal.

6. A method for receiving an input signal having an input power level and for providing an output signal having a desired output power level, the method comprising the of:
   detecting a peak voltage of a filtered input signal of the input signal;
   determining an average voltage of the filtered input signal;
   comparing the peak voltage and the average voltage and determining whether the input signal is one of a first filtered signal or a second filtered, signal;

bypassing the filtered input signal when the determined filtered input signal is the first filtered signal; or attenuating the filtered input signal when the determined filtered input signal is the second filtered signal;

comparing the averaged signal, wherein the averaged signal is one of bypassed or attenuated, to a reference signal; and providing an adjusting voltage based on the comparison signal, wherein the adjusting voltage ensures the desired output power level.

7. The method of claim 6, wherein the first input signal is a QAM signal and the second input signal is a CW signal.

8. The method of claim 6, further comprising the step of filtering the input signal, wherein the first and second input signals are transmitted in a channel, wherein the filtering filters less than the full first input signal in the channel, thereby decreasing the detected peak voltage.

9. The method of claim 8, wherein the filtering filters the full second input signal in the channel, thereby providing an accurate power level of the CW input signal.

10. The method of claim 6, further comprising one of the steps of attenuating the input signal or amplifying the input signal based on the adjusting voltage.

11. An amplifier for amplifying an input signal and for providing an output signal having a desired output power level, the amplifier comprising:

a gain stage for amplifying the input signal;

an attenuating circuit for attenuating a power level of the input signal to a desired power level; and an AGC circuit for filtering a portion of the input signal and for providing an adjusting voltage based on one of a first input signal or a second input signal and the power level of the filtered input signal, the AGC circuit comprising:

a peak detector for detecting a peak voltage of the filtered input signal;

an averaging circuit for determining an average voltage of the filtered input signal;

a comparator for receiving the peak voltage and the averaged voltage, and for determining whether the filtered input signal is the first or second input signal;

a gain switch controlled by the comparator, the gain switch for passing the filtered input signal when determined to be the first input signal, and for bypassing the filtered input signal when determined to be the second input signal, wherein, when the filtered input signal is bypassed, the input power level of the input signal is further attenuated by a predetermined level; and an error integrator for receiving the averaged voltage having been one of bypassed or attenuated, the error integrator for providing an adjusting voltage to the attenuating circuit.

12. The amplifier of claim 11, wherein the first input signal is a QAM modulated signal and the second input signal is a CW signal.

13. The amplifier of claim 11, wherein the error integrator receives a reference voltage and determines the adjusting voltage by comparing the reference voltage and the averaged voltage.

14. The amplifier of claim 11, the AGC circuit further comprising a bandpass filter, wherein the first and second input signals are transmitted in a channel, wherein the bandpass filter filters less than the full first input signal in the channel, thereby decreasing the detected power level.

15. The amplifier of claim 14, wherein the bandpass filter filters the full second input signal in the channel, thereby providing an accurate power level of the second input signal.

16. A system for transmitting signals, the system comprising:

headend devices for generating downstream signals having a power level; and transmission devices for receiving and amplifying the downstream signals having a desired power level as necessary, the transmission devices including a plurality of amplifiers, each amplifier comprising:

a gain stage for amplifying the downstream signals;

an attenuating circuit for attenuating the power level of the downstream signal to the desired power level based on an adjusting voltage; and an AGC circuit for filtering a portion of the downstream signal and for providing an adjusting voltage based on one of a first downstream signal or a second downstream signal and the power level of the filtered downstream signal, the AGC circuit comprising:

a peak detector for detecting a peak voltage of the filtered downstream signal;

an averaging circuit for determining an average voltage of the filtered downstream signal;

a comparator for receiving the peak voltage and the averaged voltage, and for determining whether the filter downstream signal is the first or second downstream signal;

a gain switch controlled by the comparator, the gain switch for passing the filtered downstream signal when determined to be the first downstream signal, and for bypassing the filtered downstream signal when determined to be the second downstream signal, wherein, when the filtered downstream signal is bypassed the power level of the downstream signal is further attenuated by a predetermined level; and an error integrator for receiving a reference voltage and the averaged voltage having been one of bypassed or attenuated, the error integrator for comparing the reference voltage and the averaged voltage for determining the adjusting voltage.

17. The system of claim 16, the AGC circuit further comprising a bandpass filter, wherein the first and second downstream signals are transmitted in a channel, wherein the bandpass filter filters less than the full first downstream signal in the channel, thereby decreasing the detected power level.

18. The system of claim 17, wherein the bandpass filter filters the full second downstream signal in the channel, thereby providing an accurate power level of the second downstream signal.

* * * * *